United States Patent [19]

Geesen et al.

[11] Patent Number: 4,484,356

[45] Date of Patent: Nov. 20, 1984

[54] APPARATUS AND METHOD FOR ACQUIRING AND PROCESSING RADIO SIGNALS RECEIVED AT DIFFERENT FREQUENCIES

[75] Inventors: Michel Geesen, Antony; Jacques Mourant, Maurepas; Daniel P. Ludwig, Ramonville-Saint-Agne, all of France

[73] Assignees: Electronique Marcel Dassault; Centre National d'Etudes Spatiales, both of Paris, France

[21] Appl. No.: 318,547

[22] Filed: Nov. 5, 1981

Related U.S. Application Data

[63] Continuation-in-part of Ser. No. 038,748, May 14, 1979, abandoned, and a continuation-in-part of Ser. No. 166,621, Jul. 7, 1980, Pat. No. 4,398,286, which is a continuation-in-part of Ser. No. 038,770, May 14, 1979, abandoned.

[30] Foreign Application Priority Data

May 16, 1978 [FR] France .................................. 78 14339
May 17, 1978 [FR] France .................................. 78 14626

[51] Int. Cl.$^3$ ..................... H04B 1/26; H04B 17/00; H03L 7/18
[52] U.S. Cl. .................................. 455/165; 324/77 C; 455/168; 455/200; 455/226
[58] Field of Search ............... 455/157, 158, 145, 226, 455/161, 165, 168, 200, 266; 324/77 C, 77 CS

[56] References Cited

U.S. PATENT DOCUMENTS 4,238,727 12/1980 Madni .......................... 324/77 CS Primary Examiner—Marc E. Bookbinder
Attorney, Agent, or Firm—Pollock, Vande Sande & Priddy

[57] ABSTRACT

Apparatus for acquiring and processing incoming radio signals received from a plurality of stations, the frequencies of which are contained in a predetermined frequency band.

The received signals are mixed with a local oscillator frequency which is repeatedly scanning the input frequency band at a fast rate produced from a frequency synthesizer whose control input is modified step by step to cycle through a corresponding predetermined set of programming values. The sweep rate of the programming value of the frequency synthesizer is so high that the stabilization time for the frequency at its output is significant with respect to the dwell time of the control signal of each programming value.

The varying frequency signals at the output of the mixer are applied to the inputs of band pass filtering channels, to derive the frequency range of the incoming signals for frequency selective circuitry arranged to demodulate the received signals. The invention is useful to the processing messsages transmitted by beacons by a satellite receiver.

12 Claims, 4 Drawing Figures

4,484,356

APPARATUS AND METHOD FOR ACQUIRING AND PROCESSING RADIO SIGNALS RECEIVED AT DIFFERENT FREQUENCIES

This application is a continuation-in-part of application Ser. No. 038,748, filed May 14, 1979, abandoned; Ser. No. 166,621, filed July 7, 1980, now U.S. Pat. No. 4,398,286, which is a continuation-in-part of Ser. No. 038,770, filed May 14, 1979, now abandoned.

FIELD OF THE INVENTION

The invention relates to apparatus for acquiring messages received at different frequencies for example from a plurality of stations, and for processing these messages to extract the information they contain.

Such apparatus may have use in a transmission installation which comprises a plurality of beacons distributed in a territory and transmitting messages in digital language by phase modulation of a carrier wave, these messages being adapted to be collected by an apparatus carried by a satellite moving above the territory either for storing the received signals in a memory or for retransmitting the same.

The messages transmitted by the various beacons reach the satellite in a random or asynchronous manner and the frequency of their carrier waves (which is typically in the order of several MHz) is unknown so that the apparatus comprises frequency analysis means for scanning a predetermined frequency band which is known to contain the transmitted carrier wave. At least one processing device having a phase locked loop for performing the demodulation of the message or messages selected in the course of the spectrum analysis is provided.

SUMMARY OF THE INVENTION

The present invention relates to improvements in such an apparatus which permit a simple and economical construction.

With regard to the spectrum analysis or scanning of the spectrum for the adjustment of apparatus for processing signals transmitted from a beacon, a programmable frequency synthesizer is used for rapid repetitive scanning of the input signal frequency spectrum to detect the frequency range of the input signal, and to set the processing devices so as to quickly bring each one in tune with a respective input signal.

Frequency synthesizers have long been used in the prior art as local oscillators for providing accurate frequency positioning of a device receiving an input signal having a known frequency.

Such synthesizers have also been used for assisting in determining the unknown frequency of a signal within a given frequency band, as described for example in U.S. Pat. No. 4,063,169 to Palmer and U.S. Pat. No. 4,198,596 to Waeselynck et al.

In these prior devices, the output frequency of the synthesizer is varied within a frequency band by changing the control data on the programming input thereof until an input signal is detected. Although the techniques used in these prior art embodiments for detecting an input signal in response to the local oscillator frequency differ from one to the other, in both cases the variation of the synthesizer control signal is stopped in response to such signal detection. The frequency of the signal detected may be derived accurately from the respective value of the local oscillator frequency on the basis of the respective programming data value on the control input of the synthesizer. In such uses reliance is upon the very accurate and stable frequency generation which may be obtained out of a frequency synthesizer.

In contrast, according to an object of the invention, a frequency synthesizer is used to cyclically and repetitively sweep the entire input frequency band within which input signals may be present. Such cycling is done under control of the programming input of the device and goes on independently of whether or not input signals are detected by a frequency analyser downstream of the mixer. The frequency analyzer is used to provide an indication of a range of frequencies which contain input signals which have been received during the scanning of the input frequency band. Such frequency range determinations in turn are used for frequency tuning of signal processing devices connected to the signal radio receiver and which operate to lock themselves on a respective received signal frequency.

The scanning speed is chosen sufficiently high to permit detection of signals having a relatively short duration within the input frequency band.

When the synthesizer control input is operated step by step at such high speed, the time required for the output frequency of the synthesizer to adjust to a new programming value when the control data are switched from one value to the next, is not negligible with respect to the total duration of one step, i.e. the dwell time of each control data value at each step.

In this case, the programming value at the control input of the synthesizer does not provide an accurate representation of the frequency of the synthesizer output. Such use is not conventional for a frequency synthesizer and is generally contrary to the intended use of such devices.

It has been found, however that, in the particular application which is contemplated in accordance with the invention, the frequency range of a received signal which can be obtained by using a fast scanning frequency synthesizer may be as good or better than the results provided by other types of local oscillators, such as a voltage controlled crystal oscillator, while bringing about additional advantages.

Although there exists a lagging error between the average frequency of a fast operated synthesizer output signal and its programming input value during each step, it has been found that effect of such lagging error on the frequency range determined to include a received signal is no greater than the errors which must be expected when a crystal oscillator is used which is controlled by a voltage even when the synthesizer is operated at a much faster sweep rate.

In this respect, a particularly advantageous feature of using the frequency synthesizer is that its output frequency may be scanned over a wider frequency band than that of a voltage controlled crystal oscillator. Consequently, the number of filtering channels required in a frequency analyzer at the output of the input mixer which is fed by this local oscillator may be less with the frequency synthesizer than with a VCXO. However, to achieve the frequency sweep in a predetermined time, the frequency synthesizer must, and does operate at a speed greater than a corresponding VCXO.

BRIEF DESCRIPTION OF THE DRAWINGS

In the description which follows, given by way of example, the accompanying drawings are referred to, in which.

DESCRIPTION OF EMBODIMENTS

Figure 1:
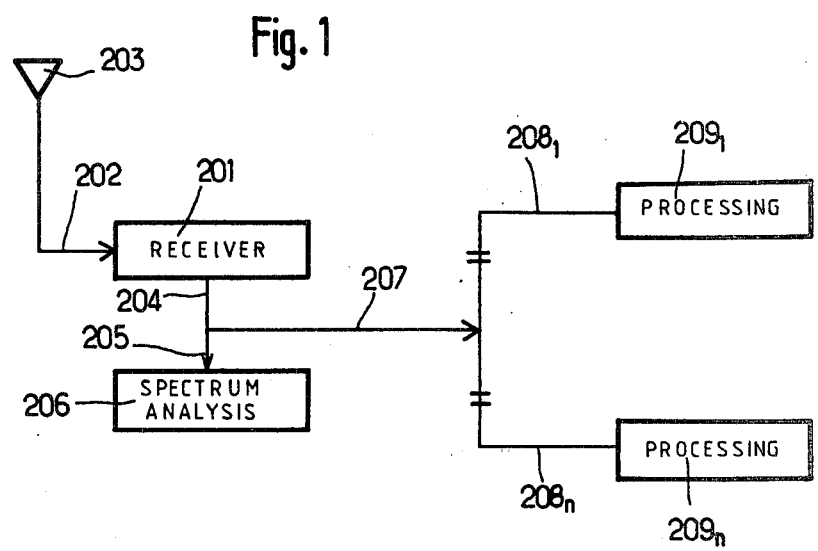
FIG. 1 is a circuit block diagram of apparatus for receiving and processing radio signals received from a plurality of stations.

A radio receiver 201 (FIG. 1), intended to furnish signals to a spectrum analyzer and processing devices, has an input 202 to which are applied signals picked up by an antenna 203. Its output 204 is divided into two branches, one 205 which constitutes the input of a device 206 for measuring the level and frequency of signals received and the other 207 starting from which are branched parallel path $208_1 \ldots 208_n$ ending at processing devices $209_1 \ldots 209_n$ for demodulating the received signals.

Figure 2:
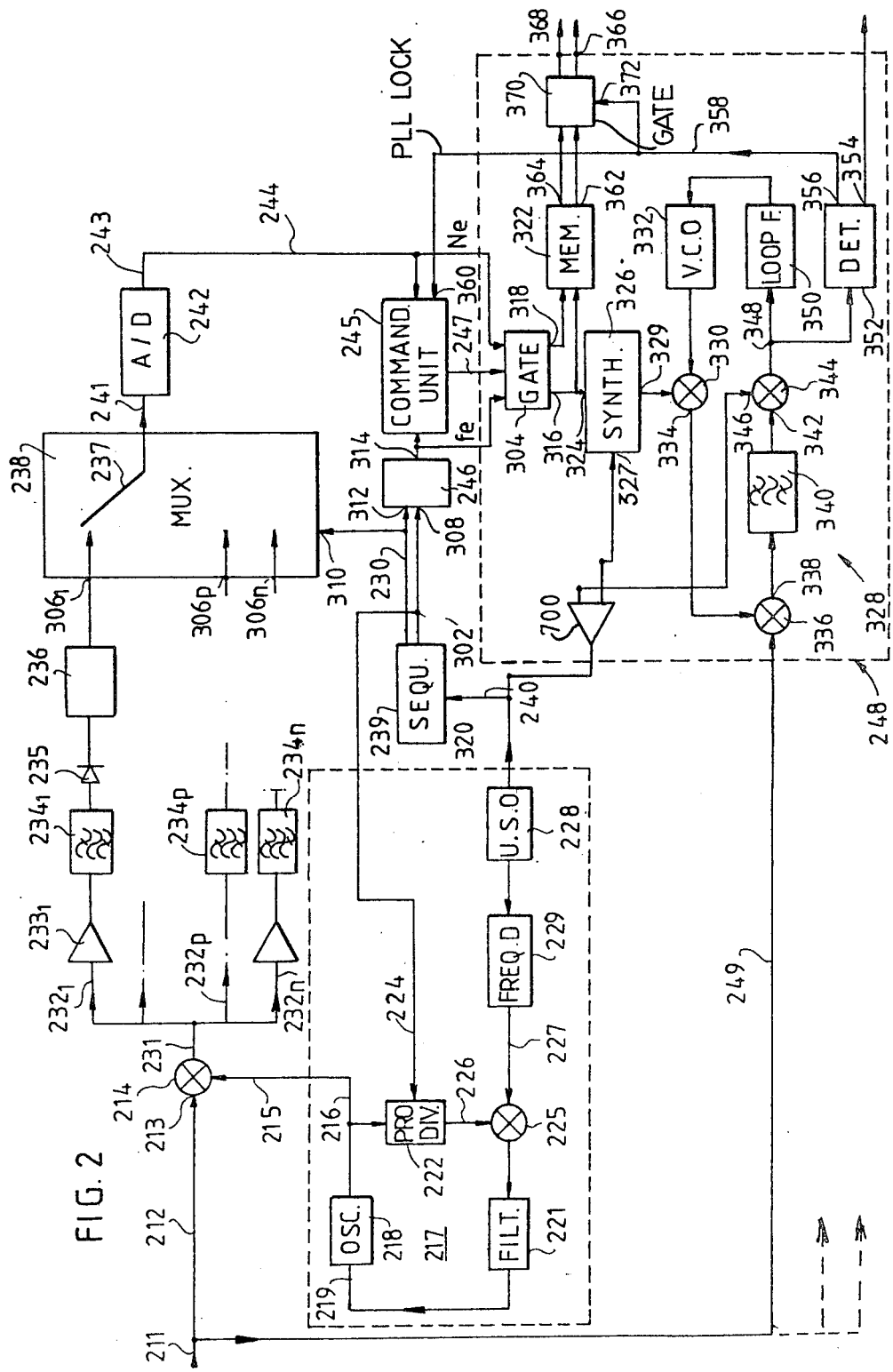
FIG. 2 is a block diagram of a portion of a circuit such as that of FIG. 1 for analyzing the frequency of the received signal.

Reference is now made to FIG. 2. The signals coming from a radio receiver, such as 201, reach input 211 which is applied by a line 212 to the input 213 of a mixer 214. The second input 215 of this mixer is connected by a line 216 to the output of oscillator 218 in a phase locked loop 217 comprising oscillator 218, the frequency of which is controlled by voltage applied by a phase comparator 225 to its input 219, via a band filter 221, and a frequency divider 222 programmable by narrow increments under the action of a programming control line 224. The loop 217 also comprises the phase comparator 225 whose input 226 coupled to the output of programmable divider 222, is part of the loop and whose other input 227 applies to the phase comparator 225 an ultrastable frequency furnished by an ultrastable oscillator 228 via a frequency divider 229 introducing a fixed division factor.

The fast repetitive frequency scanning of the VCO 218 output is controlled by the programmable divider 222 whose programming input is cycled step by step over a predetermined range of digital values.

Because of the closed loop control afforded by phase locked loop 217, the value of the frequency applied to the input 215 of the mixer 214 does not depend on the conditions of aging of the VCO 218, and the accuracy is that of the ultrastable oscillator 228.

The output 231 of the mixer 214 may be divided into a number of band pass filtering paths or channels $232_1 \ldots 232_n$ in each of which an amplifier 233 feeds a band pass filter 234, the number of paths, and therefore the number of filters, depending on the width of the frequency band scanned by the synthesizer compared with the entire width of the spectrum of be scanned at the output of receiver 201.

The output of each filter 234 is coupled via a detector 235 to a filter 236 the output of which is connected to a respective sample input 306 of a multiplexer 238 (switch 237) controlled by a line 230 out of a sequencer or timing circuit 239 connected by a line 240 to the ultrastable oscillator 228. The line 241 connected at the output of multiplexer 238 forms the input of an analog/digital converter 242 whose output 243 is applied by a line 244 to a command unit 245 also connected to the sequencer 239 via a frequency evaluation circuit 246.

At the output 247 of the command unit 245 serves to confirm couples of values of level N and frequency F which constitute the information sought by scanning the spectrum and which are present in succession on lines 244 and 314, respectively.

This information may be used for adjusting at any moment the frequency of a processing device 248 for demodulating a signal among signals which may be present on input 211 which are routed by a line 249 to this processing device 248.

It has been established that instead of using a VCXO type piezo-electric oscillator requiring a command coming from a digital/analog converter and being part of an open loop as a frequency scanning oscillator, a frequency synthesizer may be employed, including a closed loop comprising a VCO type oscillator, that is to say, non-piezo-electric, as has just been described with which, all things being equal, the scanning speed may be considerably increased in a ratio ranging from 1 to 4.

It is also possible to thus assure the scanning of a wider range of frequencies by calling upon a frequency synthesizer and not an open-loop local oscillator.

Preferably, signals received from the beacons each include a pure carrier wave portion which is unmodulated and is followed by a modulated, typically phase modulated, portion containing the particular message or data to be collected by the satellite from the respective beacon.

In operation, (FIG. 2), the synthesizer 217 is controlled by the programming input 224 of its programmable divider 222, so as to sweep a frequency band $\Delta f_m$. Thus, $\Delta f_m$ is the frequency excursion of the local oscillator signal on input 215 of mixer 214.

The programming input 224 is controlled via output 302 of sequencer 239. This output 302 is progressively and repeatedly incremented step by step over a given range of control values so as to produce a digital control signal for programmable divider, each step corresponding for example to 100 Hz on input 215 at the output of the synthesizer 217. If, for example, the output 320 cycles over 256 steps, the corresponding frequency excursion of signals on input 215 will be 25 kHz.

The output signal of the mixer 214 has a frequency corresponding to the difference between any frequency signal at the input 211 of the circuit of FIG. 2 (i.e. corresponding to output 204 of a receiver 201 of FIG. 1) and that of input 215.

This differential frequency on output 231 of mixer 214 is simultaneously applied to the n filtering channels $232_1$ to $232_n$.

The center frequencies of the band pass filters $234_l$ to $234_n$ are respectively $f_{cl}, \ldots f_{cn}$, each being offset with respect to the next by $\Delta f_m$. Consequently, if an input signal having a frequency $f_r$ is present within the input signal frequency bandwidth, the respective differential frequency on output 231 will be passed by a filter $234_p$ having center frequency $f_{cp}$, when the local oscillator frequency 215 reaches a value of $\Delta f = f_r - f_{cp}$. In practice, as the local oscillator frequency 215 varies, the output signal level of band pass filter $234_p$ increases and reaches its maximum value when $f_r - f_{cp} = \Delta f$ and then starts decreasing.

Accordingly, the input signal frequency spectrum which may be analysed by the frequency spectrum analyser constituted by synthesizer 217, mixer 214 and filter channels $232_l$ to $232_n$ has a bandwidth of $n \times \Delta f_m$. During each sweep cycle of the frequency synthesizer output 216 over its respective range $\Delta f_m$, any input signal within such spectrum will be detected by one of filter channels $232_l$ to $232_n$.

The outputs of the filtering channels may be sequentially connected by means of multiplexer 238 to analog/digital converter 242, so as to convert the respective analog level sample value at the channel output into a corresponding digital value. The values at the output 243 of A/D converter 242 are supplied via a line 244 to command unit 245 and to a gate 304 in processing unit 248, as will be explained hereinafter.

The switching rate of multiplexer 238 is so selected that during the duration of the increasing then decreasing signal level at the output of any filter channel $232_p$ corresponding to an input frequency $f_r$, several samples of the respective signal levels are sampled and digitized.

To each one of these samples levels at input $306_p$ of multiplexer 238 corresponds a respective $\Delta f_i$ value at the output of frequency synthesizer 217, which itself depends from the input 224 on programmable divider 222. The latter input value is available at the output 302 of sequencer 239. This output is coupled to an input 308 of circuit 246.

The multiplexer 238 is controlled also by sequencer 239 via line 230 which applies to its input 310 the coded address of the particular filtering channel $232_l$ to $232_n$ (input $306_l$ to $306_n$) which must be interrogated at each instant. This coded address is received on input 312 of the circuit 246 which, by an adding operation, delivers on its output 314 at each instant a digital indication of the frequency range in which the signal within the input frequency band lies corresponding to the level sampled and digitized by A/D converter 242.

This frequency range determination on output 314 is basically equal to $f_{cp} + \Delta f_i$ where $\Delta f_i$ is the instantaneous frequency output value of frequency synthesizer 217 as represented by the digital indication on its programming input 224. It is applied to a command unit 245 as well as to gate 304 at the input of processing unit 248.

Accordingly, for each frequency programming step during one sweep cycle of the frequency synthesizer 217, a frequency range value $f_e$ may be associated to the respective level value $N_e$, both values being supplied to command unit 245 and to the gates 304 of each processing device 248.

The sequencer 239 is a conventional combination of counters which are supplied by pulses from the ultrastable oscillator 228 to provide sweep cycle control signals on its output 302 and coded control addresses for operating multiplexer 238 on line 230.

A frequency divider 700 is coupled at the output of the ultrastable oscillator 228. It performs the frequency division of the oscillator 228 by several constant factor to deliver respective accurate reference frequency signals to each processing unit 248 as will be described later.

Figure 3:
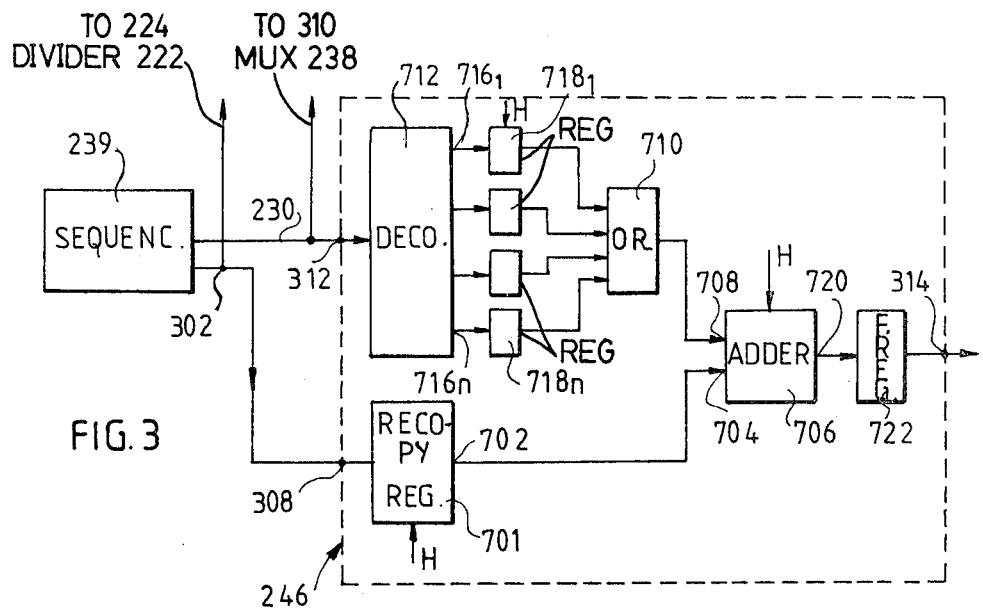
FIG. 3 is a block diagram of a frequency range indicating circuit.

FIG. 3 depicts a schematic embodiment of frequency range indication circuit 246. A recopy register 701 is connected at the multi-bit input 308 of the circuit 246 to store a digital indication of each synthesizer input programming value. Output 702 of register 701 is coupled to one input 704 of an adder 706 whose other input 708 is coupled at the output of an OR gate 710. A decoder 712 is coupled to a multi-bit input 312 of circuit 246 which receives the address control signals of multiplexer 238. The decoder 712 has n outputs $716_l$ to $716_n$, each coupled to the input of the respective register $718_l$ to $718_n$. These registers are loaded with counts which correspond to the center frequencies of band pass filters $234_l$ to $234_n$. The output of each one of these registers is coupled to a respective input of OR circuit 710. Each register is controlled for readout by clock signals such as H shown for register $718_l$. Accordingly, if decoder output $716_l$, for example, is energized, the content of respective register $718_l$ will be read out of the input 708 of adder 706 via OR circuit 710 upon receipt of the H timing signal.

At the same time, the H timing signal also triggers the readout of the content of recopy register 701 to input 704 of adder 706 to deliver to an output 720 of this adder a signal which is stored in a frequency register 722 whose output forms the output 314 of circuit 246 and delivers the frequency range for each multiplexer 238 addressing position.

Operation of the processing unit 248 (FIG. 2) will now be described. Upon receipt of an authorization signal on line 247 from command unit 245 (which will be derived as explained hereinafter), the frequency range $f_e$ and the respective digitized level values $N_e$ of a received signal are passed by gate 304 (outputs 316 and 318 respectively) to a memory 322. Also, the frequency range $f_e$ at the output of 316 gate 304 is fed to the frequency programming input 324 of a frequency synthesizer 326 which operates to initially set the operating frequency of processing device 248 to the respective frequency range. From this value a phase locked loop 328 operates to attempt to lock itself to a respective frequency signal present on line 249 at the input of processing unit 248. Line 249 is directly connected to input 211 (output 204 of FIG. 1).

Briefly summarized, synthesizer 326 whose input 327 receives a reference frequency from divider 700 converts the digital indication on its input 324 into an oscillating signal of respective frequency on its output 329, which is passed to a mixer which receives also the output signal of a voltage controlled oscillator 332. The differential signal at the output 334 of mixer 330 is applied to one input of a mixer 336 which receives on its second input the signals on line 249. Output 338 of mixer 336 is coupled to a narrow band pass filter 340 having an accurately determined center frequency to apply its resulting output signal on input 342 of a phase comparator 344 receiving on its second input 346 a reference frequency signal out of divider 700. Output 348 of mixer 344 controls via a loop filter 350 the voltage control input of VCO 332 thus completing the phase locked loop 328.

When the loop 328 is locked on a signal on input 249, a substantially DC signal on output 348 appears which corresponds to the phase modulation, if any, of the input signal and is passed to a detecting circuit 352 having one output 354 which is the data-output of the device 348 and a second output 356 which is connected via line 358 to an input 360 of command unit 245 thereby signalling that phase locked loop 328 is locked on an input signal.

As indicated before, several parallel connected processing units 248 identically arranged may be provided. The command unit 245 which is not part of this invention, is a logical circuit which may be for example operative for detecting when the digitized signals out of each filtering channels $232_l$ to $232_n$ go through a maximum level $N_{max}$. If such a signal is detected for example in input $306_p$, a respective authorization signal is sent on line 247 to each processing unit 248 whose phase lock indication on output 356, as received on input 360 of command unit 245, indicates that the respective unit is available, i.e. not locked on a particular input signal. Upon receiving such signal, gate 304 passes the respective value $N_{pmax}$ and respective frequency estimate $f_{pe}$ to memory 322. The frequency estimate is also applied for setting the frequency of synthesizer 326 to a value which is by neccesity close to that of the input signals on line 249 from which such frequency estimate is originated in the spectrum analysis apparatus. In order to prevent identical couples $N_{pmax}$ and $f_{pe}$ to be assigned to different processing devices 248, a predetermined hierarchy is established between them in the command unit so that when one of these couples is assigned to an available processing unit, it may not be assigned to any other.

Memory 322 of each processing unit 248 has two outputs, respectively 362 and 364 for the frequency estimate and the maximum level, respectively, which are connected to outputs 366 and 368 of this processing unit via a gate 370 whose control input 372 is connected to phase lock indication line 358. Accordingly, the content of memory 322 may only be transmitted to a telemetry conditioning unit, not shown, when the respective processing unit has locked on a given input signal for processing the same.

Figure 4:
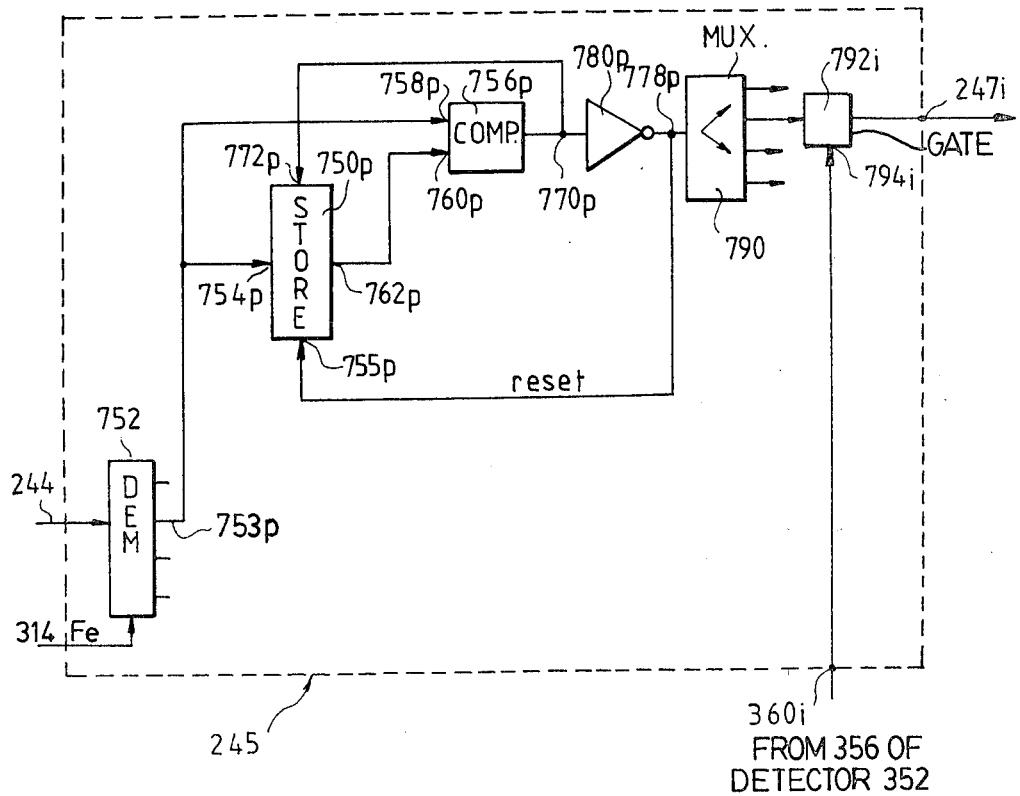
FIG. 4 is a very schematic block diagram of a command unit such as represented in FIG. 2.

A simplified embodiment of a command unit 245 is depicted by FIG. 4.

Each digital level indication from a respective filtering channel $232_p$ reaching input 244 of command unit 245 is addressed by a demultiplexer 752, via respective output $753_p$ to input $754_p$ of a digital store $750_p$ and to an input $758_p$ of a digital comparator $756_p$. The other input $760_p$ of comparator $756_p$ is coupled at the output $762_p$ of store $750_p$.

For each new digital level indication, the circuit operates in two steps. First, the new level indication on output $753_p$ is compared to the content of store $750_p$ which is normally the last level indication acquired from the respective filter channel $232_p$. If the new level is greater than the stored level, a signal at the output $770_p$ of comparator $760_p$ enables input $772_p$ of store $750_p$ to store the new value on input $754_p$ in place of the previously stored value.

In the opposite situation where the last stored value was greater than the newly acquired level value, no signal is present at the output $770_p$ of comparator $760_p$. This in turn produces a signal on output $778_p$ of an inverter $780_p$ coupled to this output $770_p$, which is operative to perform two functions:

First, via a multiplexer circuit 790, it sends a control signal sequentially to each one of a plurality of gates 792, there being provided one gate $792_i$ for each processing unit $248_i$. Each gate $792_i$ is controlled by the signal on input $360_i$ indicating that the respective processing unit $248_i$ is not already phase locked (see FIG. 2, output 356 of detecting circuit 352). If gate $792_i$ is enabled by this authorization on its input $794_i$, the control signal out of multiplexer 790 is transmitted on line $247_i$ to gate $304_i$ of respective processing unit $248_i$ (see FIG. 2).

The signal at output $778_p$ is also effective to send a reset signal on reset input $755_p$ of the store $750_p$ so as to erase the previous level indication from this store.

Accordingly, the command unit 245 operates to watch the signal levels at the output of each filtering channels $232_1$ to $232_n$ and to determine the maximum of each series of levels corresponding to an input signal of respective frequency among the radio signal received. An authorization is then produced for an available processing unit $248_i$ (i.e. not locked on another input signal), to acquire the respective maximum level $N_e$ and frequency range $f_e$ via gate 304.

It will be recognized by the man skilled in the art that the command unit may be implemented by the use of appropriate combination of hardware circuits or by a programmed microprocessor or other programmable device to effect proper allocation of frequency estimate and respective associated level values to the processing unit.

In an example, the input frequency band to be scanned is 25 kHz. The frequency synthesizer produces a sweep signal 215 having an excursion of 25 kHz which is incremented by steps of 100 Hz.

As indicated before, each beacon signal received comprises an unmodulated portion followed by a phase modulated portion. The unmodulated or pure carrier wave portion is intended for the detection of the arrival of such message and the preparation of a respective processing unit for receiving and demodulating the following modulated portion. It will be understood that the unmodulated portion must be at least as long as the sweep cycle duration. Accordingly, the faster of the scanning speed of the input frequency spread band, the shorter the unmodulated portion of each of the beacon signals may be. Moreover, the shorter this unmodulated portion, the shorter the average overall time during which each processing unit will be busy and, consequently, the fewer processing units such as 248 have to be provided for receiving a maximum number of simultaneous signals as the satellite overflies the beacons in any one part of its revolution.

It has been found that by using such a frequency synthesizer for generating the sweep frequency a wide input frequency band may be swept quite fast while keeping accurate track of the sweep frequency value.

Specifically, if a frequency synthesizer is used to sweep a frequency band of 25 kHz instead of an other type of variable oscillator such as a VCXO having typically a 6.25 kHz frequency excursion, the number of filtering channels needed at the output of the frequency analysis mixer 214 is one, instead of four, to scan the input frequency spread band of 25 kHz. Accordingly, the amount of filtering hardware required is diminished. However, if one wishes to maintain the same overall input frequency band sweeping time for example 80 milliseconds, the frequency synthesizer sweep speed must be four times greater than that of the other type of variable oscillators such as a VCXO.

Accordingly, if the frequency synthesizer programming input sweeps 25 kHz by steps of 100 Hz in 80 milliseconds, each digital frequency indication on the programming input 224 will stay about 300 microseconds.

When the indication on the programming input 224 switches from one value to the next, the synthesizer loop 217 operates to vary the frequency of signal on mixer input 215 to reach the new value posted on its programming input. However, this adjustment requires a time interval which is not negligible when compared to the total 300 μs time during which the programming value is posted. Typically, the time constant of the synthesizer loop 217 may be between 30 and 100 microseconds. Assuming the latter value for example, at the end of the dwell time of a given programming value on input 224, the synthesizer output signal frequency will be within 1% of the programmed value. The actual synthesizer output frequency thus varies throughout this dwell time interval, fast at the beginning thereof and increasingly more slowly thereafter.

This is an unconventional way of operating a frequency synthesizer, which is normally used for the accurate frequency positioning of the output signal which it provides, after the output frequency has stabilized.

In the instant case, by reason of the high scanning speed required, the frequency applied to the mixer 214 is variable during each 300 microseconds step and its average value is not accurately represented by the synthesizer programming input value. This lack of accuracy is referred to here as the lagging error of the synthesizer. It has been found however that, within the framework of the particular application herein contemplated, such error is acceptable for providing frequency estimates corresponding to the detected levels, in order to control a quick adaptation of each processing device to the frequency of a respective detected input signal.

In addition, it has been found that despite such lagging error, results were as good as or better than with other types of variable frequency oscillators, for example VCXO's, which are controlled by an analog signal, and this even though such oscillators operate at a lesser speed on narrower frequency excursion range.

Errors due to drift of the VCXO because of aging or other factors affecting an oscillator controlled in an open loop are eliminated. The error in determining the frequency range of the signal for each level value is substantially smaller than 100 Hz and as good or better than that obtained with a VCXO operating under the conditions previously described, which may typically be about ±80 Hz taking into account inevitable various sources of noise.

These results are achieved with a simple frequency analysis device including only one band pass filtering channel for a 25 KHz input signal frequency spread band. A wider band, for example a 100 KHz wide frequency band, may be scanned by using in accordance with the invention the previous frequency synthesizer (25 KHz excursion) with four band pass filtering channels $232_1$ to $232_4$ at the output of mixer 214, having staged center frequencies at 25 KHz from each other. Thus, less filtering hardware than with a conventional variable oscillator is required and errors resulting from uncertainties in the exact values of the center frequencies of the respective band pass filters are fewer, or, alternatively, for a given amount of hardware a much wider input frequency band may be scanned which sufficient speed.

We claim:

1. Apparatus for processing radio frequency signals which lie within a predetermined input frequency band comprising:
   means for receiving said radio frequency signals;
   frequency synthesizer means having a digital input for producing an output signal having a frequency controlled by a digital signal applied to said input, whereby said output signal frequency changes in a lagging relationship with corresponding changes in a digital signal applied to said digital input;
   means for heterodyning said received radio signals with said frequency synthesizer means output signal;
   band pass filter means connected to receive a signal from said heterodyning means and providing multiple outputs, each representing a different frequency range;
   programming means connected to apply digital signals cycled over a predetermined range to said frequency synthesizer means digital input at a rate which produces changes in said output signal frequency which lags the changes in said digital signals by a delay approaching the time each of said digital signals dwells on said digital input, whereby said frequency synthesizer means output signal frequency is continuously swept in response to cycling said digital signals;
   means coupled to said programming means and to said band pass filter means multiple outputs for determining which of said outputs is delivering a signal thereby identifying a frequency range in which said radio frequency signals lie, and generating a signal representative of said frequency range; and
   signal processing means operatively connected to receive said signal representative of said frequency range of said radio frequency, and coupled to receive said radio frequency signal, said signal processing means being frequency tuned in response to said signal representative of the frequency range of said radio frequency signal permitting processing of said radio frequency signal.

2. Apparatus of claim 1, wherein said means for identifying a frequency range comprises:
   means for detecting successive values of the signal level at each of the outputs of said band pass filter means; and
   means responsive to the programming means for deriving a frequency range in which the received signal lies for at least one of the detected signal level values.

3. Apparatus according to claim 1 wherein said band pass filter circuit means comprises a plurality of parallel band pass filter circuits connected to receive the output signal of said heterodyning means, each of said band pass filter circuits having a respective distinct center frequency, and said means for determining a frequency range comprises means responsive to each of the parallel filter circuits which produces a detected level value related to said center frequencies.

4. The apparatus of claim 3, wherein said center frequencies are spaced apart in a stepped relationship by frequency intervals, substantially equal to the bandwidth of said frequency synthesizer means.

5. The apparatus of claim 3, further comprising multiplexer means for sequentially scanning the outputs of said band pass filter circuits and for delivering signal amplitude level data related to respective ones of said center frequencies in synchronism with said scanning.

6. The apparatus of claim 5, wherein said level detecting means comprises an analog to digital converter coupled to the output of said multiplexing means.

7. The apparatus of claim 2 wherein said means for determining a frequency range in which said radio frequency signals lie provides a plurality of signals indicating a plurality of frequency ranges in response to a plurality of received radio frequency signals.

8. The apparatus of claim 7 further comprising means allocating one of said signals indicating said frequency ranges to said signal processing means, and for allocating the remaining of said signals indicating said frequency ranges to additional signal processing means.

9. The apparatus of claim 8 further comprising additional signal processing means to receive said remaining of said signals indicating said frequency ranges and to receive said radio frequency signals.

10. A method for determining the frequency range containing a received radio frequency signal lying within a predetermined frequency band comprising:

generating a frequency scanning local signal with a frequency synthesizer having a digital frequency control input by applying a cycle of digital signals which change in steps on said control input, said local signal frequency cyclically varying over a frequency range related to said radio frequency signal, said local signal frequency variations being delayed with respect to changes in said digital signal a time which approaches the time each digital signal dwells on said control input;

heterodyning said radio signal with said scanning local signal;

selecting at least one bandwidth for passing a heterodyned radio signal in response to a bandwidth selection signal;

monitoring the level of said heterodyned signal within said selected bandwidth; and generating a frequency range signal identifying a range in which said radio frequency lies in response to said monitored signal level, said frequency bandwidth selection signal and the digital signal controlling said frequency synthesizer.

11. A method according to claim 10 further comprising the step of adjusting in response to said frequency range signal the operating frequency of a means for demodulating the received signal whereby said received radio frequency signal may be detected.

12. A method according to claim 10 or 11, wherein the stabilization time constant of said frequency synthesizer is between 10 and 30 per cent of the dwell time of the digital signal at each step.

* * * * *